(12) United States Patent
Hou et al.

(10) Patent No.: US 10,128,208 B2
(45) Date of Patent: Nov. 13, 2018

(54) PACKAGE SUBSTRATES, PACKAGED SEMICONDUCTOR DEVICES, AND METHODS OF PACKAGING SEMICONDUCTOR DEVICES

(71) Applicant: Taiwan Semiconductor Manufacturing Company, Ltd., Hsinchu (TW)

(72) Inventors: Hao-Cheng Hou, Hsinchu (TW); Yu-Feng Chen, Hsinchu (TW); Jung Wei Cheng, Hsinchu (TW); Yu-Min Liang, Zhongli (TW); Tsung-Ding Wang, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/917,962

(22) Filed: Mar. 12, 2018

(65) Prior Publication Data
US 2018/0204815 A1    Jul. 19, 2018

Related U.S. Application Data

(62) Division of application No. 14/213,774, filed on Mar. 14, 2014, now Pat. No. 9,917,068.

(51) Int. Cl.
*H01L 21/56* (2006.01)
*H01L 23/00* (2006.01)
(Continued)

(52) U.S. Cl.
CPC ............ *H01L 24/17* (2013.01); *H01L 21/563* (2013.01); *H01L 23/13* (2013.01); *H01L 23/49822* (2013.01); *H01L 23/49827* (2013.01); *H01L 24/11* (2013.01); *H01L 24/81* (2013.01); *H05K 3/3436* (2013.01); *H01L 2224/16113* (2013.01); *H01L 2224/16227* (2013.01);
(Continued)

(58) Field of Classification Search
CPC combination set(s) only.
See application file for complete search history.

(56) References Cited

U.S. PATENT DOCUMENTS

| 4,143,456 A | 3/1979 | Inoue |
| 4,760,440 A | 7/1988 | Bigler et al. |

(Continued)

FOREIGN PATENT DOCUMENTS

| TW | 200522326 A | 7/2005 |
| TW | 200629501 A | 6/2010 |

(Continued)

OTHER PUBLICATIONS

Integrated Publishing, "Spot-facing," www.tpub.com, http://draftingmanuals.tpub.com/14276/css/14276_162.htm, downloaded Dec. 24, 2013, 2 pages.

(Continued)

*Primary Examiner* — Michael Lebentritt
*Assistant Examiner* — Jordan Klein
(74) *Attorney, Agent, or Firm* — Slater Matsil, LLP (57) ABSTRACT

In some embodiments, a package substrate for a semiconductor device includes a substrate core and a material layer disposed over the substrate core. The package substrate includes a spot-faced aperture disposed in the substrate core and the material layer.

20 Claims, 9 Drawing Sheets

FIG. 12

(51) Int. Cl.
*H05K 3/34* (2006.01)
*H01L 23/13* (2006.01)
*H01L 23/498* (2006.01)

(52) U.S. Cl.
CPC ............... *H01L 2224/81805* (2013.01); *H01L 2924/00011* (2013.01); *H01L 2924/01029* (2013.01); *H01L 2924/12042* (2013.01); *H01L 2924/15151* (2013.01); *H01L 2924/181* (2013.01); *H05K 2201/09072* (2013.01); *H05K 2201/10977* (2013.01); *Y02P 70/613* (2015.11)

(56) References Cited

U.S. PATENT DOCUMENTS

| | | | | |
|---|---|---|---|---|
| 5,218,234 A * | 6/1993 | Thompson | ............... | H01L 21/56 257/738 |
| 5,710,071 A * | 1/1998 | Beddingfield | ........ | H01L 21/563 257/778 |
| 6,038,136 A | 3/2000 | Weber | | |
| 6,057,178 A * | 5/2000 | Galuschki | ............. | H01L 21/563 257/E21.503 |
| 6,074,897 A | 6/2000 | Degani et al. | | |
| 6,081,997 A * | 7/2000 | Chia | ..................... | H01L 21/565 257/E21.504 |
| 6,157,086 A | 12/2000 | Weber | | |
| 6,369,449 B2 | 4/2002 | Farquhar et al. | | |
| 6,490,166 B1 | 12/2002 | Ramalingam et al. | | |
| 6,580,173 B2 * | 6/2003 | Okada | .................. | H01L 21/563 257/774 |
| 6,756,251 B2 | 6/2004 | Lee | | |
| 6,768,209 B1 | 7/2004 | Jiang et al. | | |
| 6,772,512 B2 | 8/2004 | Tsai et al. | | |
| 7,030,487 B1 | 4/2006 | Keng | | |
| 7,791,209 B2 | 9/2010 | Hisada et al. | | |
| 8,129,828 B2 | 3/2012 | Maeda | | |
| 8,878,360 B2 | 11/2014 | Meyer et al. | | |
| 2002/0095192 A1 | 7/2002 | Pu et al. | | |
| 2003/0042617 A1 * | 3/2003 | Lee | ...................... | H01L 21/563 257/778 |
| 2005/0145846 A1 | 7/2005 | Brandenburger | | |
| 2006/0234427 A1 | 10/2006 | Odegard et al. | | |
| 2009/0194322 A1 * | 8/2009 | Usui | ...................... | H05K 1/115 174/260 |
| 2009/0229513 A1 * | 9/2009 | Hisada | .................. | H01L 21/563 118/50 |
| 2010/0001378 A1 | 1/2010 | Denatale et al. | | |
| 2011/0147919 A1 | 6/2011 | Sutardja | | |
| 2014/0117543 A1 | 5/2014 | Park | | |
| 2015/0342040 A1 | 11/2015 | Wang | | |

FOREIGN PATENT DOCUMENTS

| | | |
|---|---|---|
| TW | 201021636 A | 6/2010 |
| TW | 201405765 A | 2/2014 |

OTHER PUBLICATIONS

Wikipedia, "Spotface," http://en.wikipedia.org/wiki/Spot_face, downloaded Dec. 24, 2013, 2 pages.

* cited by examiner

PACKAGE SUBSTRATES, PACKAGED SEMICONDUCTOR DEVICES, AND METHODS OF PACKAGING SEMICONDUCTOR DEVICES

PRIORITY CLAIM

This application is a divisional of U.S. application Ser. No. 14/213,774, filed Mar. 14, 2014, entitled "Package Substrates, Packaged Semiconductor Devices, and Methods of Packaging Semiconductor Devices," now U.S. Pat. No. 9,917,068, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, as examples.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure are related to package substrates for semiconductor devices, methods of packaging semiconductor devices, and structures thereof. Packaged semiconductor devices that have been packaged using the novel package substrates, and methods of manufacturing the package substrates are also disclosed. The package substrates include a spot-faced aperture formed therein, to be described further herein.

Figure 1:
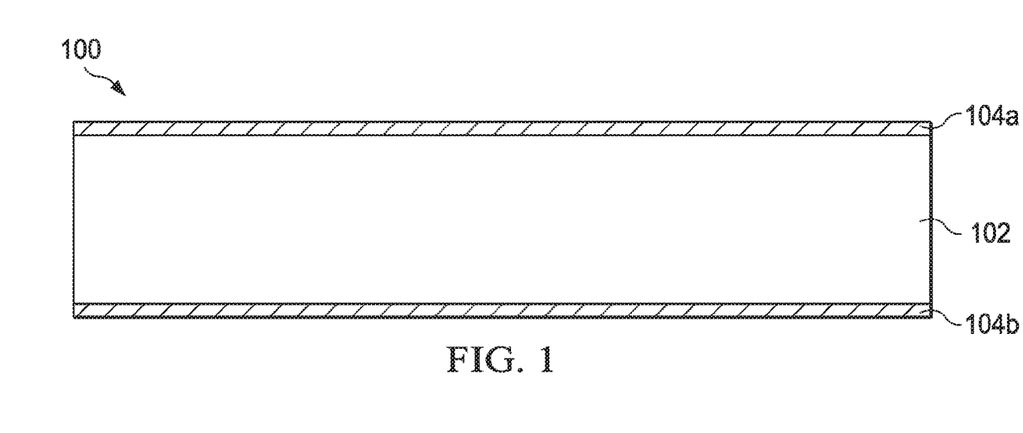
FIGS. 1 through 6 are cross-sectional views showing a method of manufacturing a package substrate at various stages in accordance with some embodiments of the present disclosure.

FIGS. 1 through 6 are cross-sectional views showing a method of manufacturing a package substrate 100 at various stages of manufacturing in accordance with some embodiments of the present disclosure. The package substrate 100 comprises a flip-chip package substrate in accordance with some embodiments. Referring first to FIG. 1, there is shown a package substrate 100 that includes a substrate core 102. The substrate core 102 comprises glass fiber, resin, filler, other materials, and/or combinations thereof in some embodiments, for example. In some embodiments, the substrate core 102 includes one or more passive components (not shown) embedded inside. Alternatively, the substrate core 102 may comprise other materials or components.

In some embodiments, the package substrate 100 includes a conductive material 104a and 104b disposed on each side of the substrate core 102, as shown in FIG. 1. The conductive material 104a and 104b comprises copper or a copper alloy comprising a thickness of about 5 μm to about 25 μm, for example. Alternatively, the conductive material 104a and 104b may comprise other materials and dimensions. In some embodiments, the package substrate 100 does not include conductive material 104a and 104b formed thereon, and the conductive material 104a and 104b is formed on the substrate core 102. The conductive material 104a and 104b may be formed using plating, physical vapor deposition (PVD), sputtering, chemical vapor deposition (CVD), or other methods.

Figure 2:
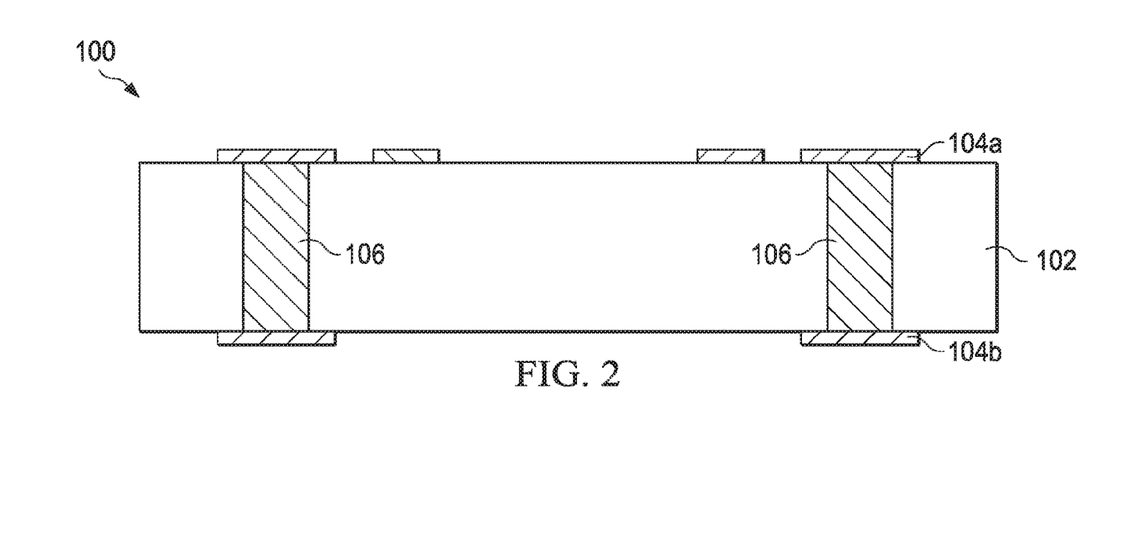

The conductive material 104a and 104b is patterned using photolithography processes, as shown in FIG. 2. For example, conductive material 104a may be patterned by forming a layer of photoresist (not shown) over the conductive material 104a, and exposing the layer of photoresist to light or energy reflected from or transmitted through a lithography mask (also not shown) having a desired pattern thereon, which transfers the pattern from the lithography mask to the layer of photoresist. The layer of photoresist is then developed, and exposed (or unexposed, depending on whether the photoresist comprises a positive or negative photoresist) regions of the layer of photoresist are then ashed or etched away, leaving the patterned layer of photoresist left remaining over the conductive material 104a. The layer of photoresist is then used as an etch mask during an etch process, which transfers the pattern in the photoresist to the conductive material 104a, as shown in FIG. 2. The layer of photoresist is then removed. Conductive material 104b may be patterned using a similar photolithography process, using another layer of photoresist and lithography mask, for example.

Alternatively, the conductive material 104a and/or 104b may comprise a seed layer, in some embodiments. The conductive material 104a and/or 104b is covered with a layer of photoresist (not shown) or other material, which is patterned with a desired pattern using photolithography. A conductive material such as copper or a copper alloy is plated onto the exposed conductive material 104a and/or 104b through the patterned photoresist, using an electroplating or electro-chemical plating (ECP) process. The layer of photoresist is removed, and the conductive material 104a and/or 104b comprising the seed layer is removed in regions where the layer of photoresist resided during the plating process. The conductive materials 104a and 104b comprise a plurality of contacts formed on each side of the substrate core 102 that provide electrical connections for the substrate core 102, for example.

A plurality of plated-through holes (PTHs) 106 is formed within the substrate core 102, also shown in FIG. 2. The PTHs 106 comprise a conductive material such as copper, a copper alloy, or other conductors, and may include a barrier layer, liner, seed layer, and/or a fill material, in some embodiments. The PTHs 106 provide vertical electrical connections from one side of the substrate core 102 to the other side of the substrate core 102. For example, some of the PTHs 106 are coupled between a contact 104a on one side of the substrate core 102 and a contact 104b on an opposite side of the substrate core 102. Holes for the PTHs 106 may be formed using a drilling process, photolithography, a laser process, or other methods, as examples, and the holes of the PTHs 106 are then filled with conductive material.

In some embodiments, the PTHs 106 are formed before the contacts 104a and 104b are formed. In other embodiments, the PTHs 106 are formed after the contacts 104a and 104b are formed. The PTHs 106 may extend through the contacts 104a and 104b in these embodiments, not shown. For example, ends of the PTHs 106 may extend through the contacts 104a and 104. Only two PTHs 106 are shown in FIGS. 2 through 6; however, alternatively, dozens or hundreds or more of the PTHs 106 may be formed across the package substrate 100 in accordance with some embodiments.

Figure 3:
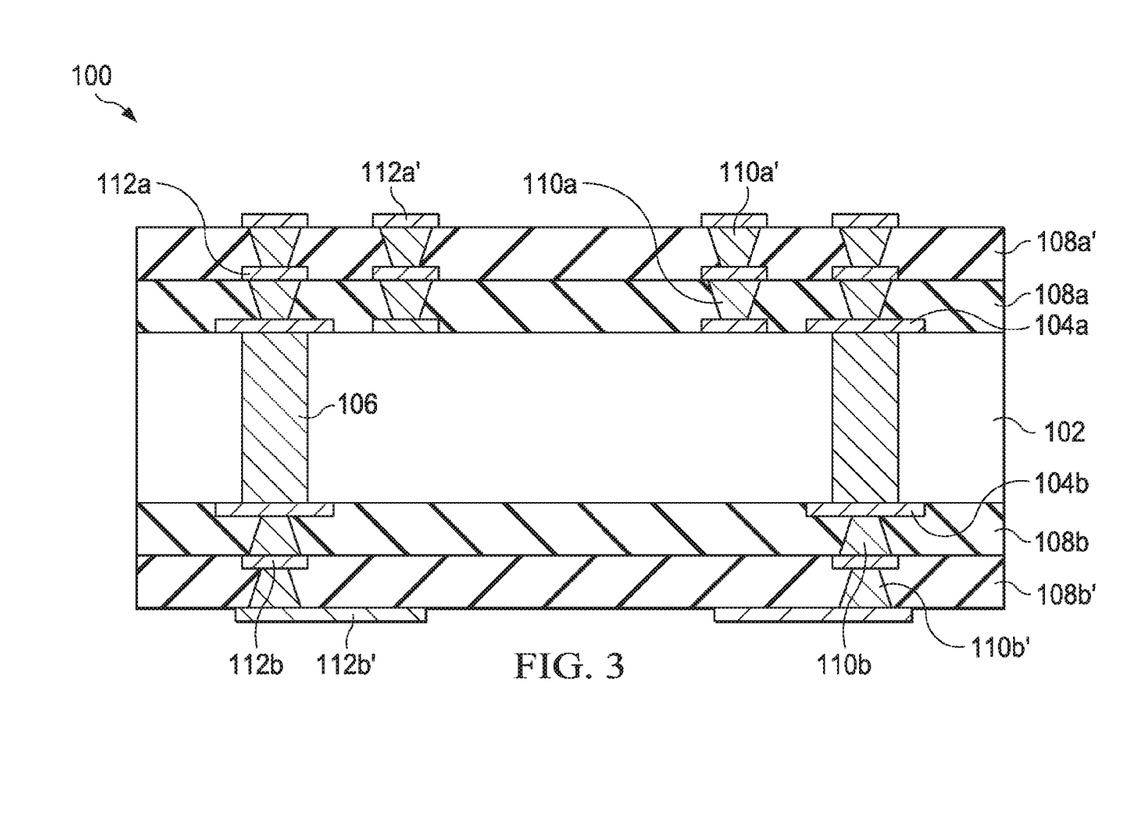

A plurality of insulating materials 108a and 108a', vias 110a and 110a', and contacts 112a and 112a' are formed over the contacts 104a and the substrate core 102, as shown in FIG. 3. The vias 110a and 110a' and contacts 112a and 112a' may comprise interconnects of an interconnect layer in some embodiments. The contacts 104a, insulating materials 108a and 108a', vias 110a and 110a', and contacts 112a and 112a' comprise build-up layers of the package device 100 in some embodiments, for example. The vias 110a and 110a' and contacts 112a and 112a' comprise copper or a copper alloy in some embodiments. The insulating materials 108a and 108a' comprise a dielectric material or insulating film such as an Ajinomoto build-up film (ABF) provided by Ajinomoto Fine-Techno Co., Inc. or a prepreg material (i.e., a plastic material pre-impregnated with a resin or other materials), in some embodiments. Alternatively, the vias 110a and 110a', contacts 112a and 112a', and insulating materials 108a and 108a' may comprise other materials manufactured by other suppliers.

To form the insulating materials 108a and 108a', vias 110a and 110a', and contacts 112a and 112a', an additive process or a semi-additive process is used, in some embodiments. For example, first, an insulating material 108a is formed over the contacts 104a and the substrate core 102. The insulating material 108a is patterned using a drilling process to form a pattern for the vias 110a. A conductive material is formed within the patterned insulating material 108a to form the vias 110a. A conductive material is formed over the insulating material 108a and the vias 110a, and the conductive material is patterned using a lithography process to form contacts 112a. The conductive material may comprise excess conductive material formed over the insulating material 108a during the process used to fill the patterned insulating material 108a and form the vias 110a in some embodiments, so that an additional deposition process is not required. Insulating material 108a' is then formed over insulating material 108a and contacts 112a, and insulating material 108a' is patterned with a pattern for vias 110a'. A conductive material is formed over the patterned insulating material 108a', forming the vias 110a'. A conductive material is formed over the vias 110a' and insulating material 108a', and the conductive material is patterned to form contacts 112a'. The conductive material may comprise excess conductive material formed over the insulating material 108a' during the process used to fill the patterned insulating material 108a' and form the vias 110a' in some embodiments, so that an additional deposition process is not required. Alternatively, the insulating materials 108a and 108a', vias 110a and 110a', and contacts 112a and 112a' may be formed using other methods and may comprise other materials. One or more drilling methods, subtractive etch processes, and/or plating processes may be used to form the insulating materials 108a and 108a', vias 110a and 110a', and contacts 112a and 112a' in some embodiments, for example.

A plurality of insulating materials 108b and 108b', vias 110b and 110b', and contacts 112b and 112b' are formed over the contacts 104b and the substrate core 102 on the opposite side of the substrate core 102, also shown in FIG. 3. The insulating materials 108b and 108b', vias 110b and 110b', and contacts 112b and 112b' may comprise similar materials and may be formed using similar methods as described for the insulating materials 108a and 108a', vias 110a and 110a', and contacts 112a and 112a' on the other side of the substrate core 102, for example. The contacts 104b, insulating materials 108b and 108b', vias 110b and 110b', and contacts 112b and 112b' comprise an interconnect structure or build-up layers of the package substrate 100 in some embodiments.

The build-up layers of the package substrate 100 (e.g., the build-up layer comprising contacts 104a, insulating materials 108a and 108a', vias 110a and 110a', and contacts 112a and 112a', or the build-up layer comprising contacts 104b, insulating materials 108b and 108b', vias 110b and 110b', and contacts 112b and 112b') are also referred to herein, e.g., in some of the claims, as material layers disposed over the substrate core 102. A portion of the aperture 114 is formed in a portion of at least one of the material layers disposed over the substrate core 102, e.g., in a portion of at least one of the build-up layers disposed over the substrate core 102, in some embodiments.

Two insulating materials 108a, 108a', 108b, and 108b' are shown on each side of the substrate core 102 in the drawings; however, alternatively, only one insulating material, no insulating material, or three or more insulating materials may be formed on each side of the substrate core 102. Likewise, other numbers of via layers and/or contact layers may be included on the package substrate 100, such as zero, one, or three or more.

The contacts 104a and 104b, vias 110a and 110a', contacts 112a and 112a', vias 110b and 110b', and contacts 112b and 112b' comprise horizontal electrical connections of the package substrate 100 in accordance with some embodiments, for example. Contacts 112a, 112a', 112b, and 112b' may include fan-out regions so that a footprint of contacts on one side of the substrate core 102 is spread out or made wider than a footprint of contacts on an opposite side of the substrate core 102 in some embodiments, for example. Contacts 112b' are wider than contacts 112a' in some embodiments, as another example.

Figure 4:
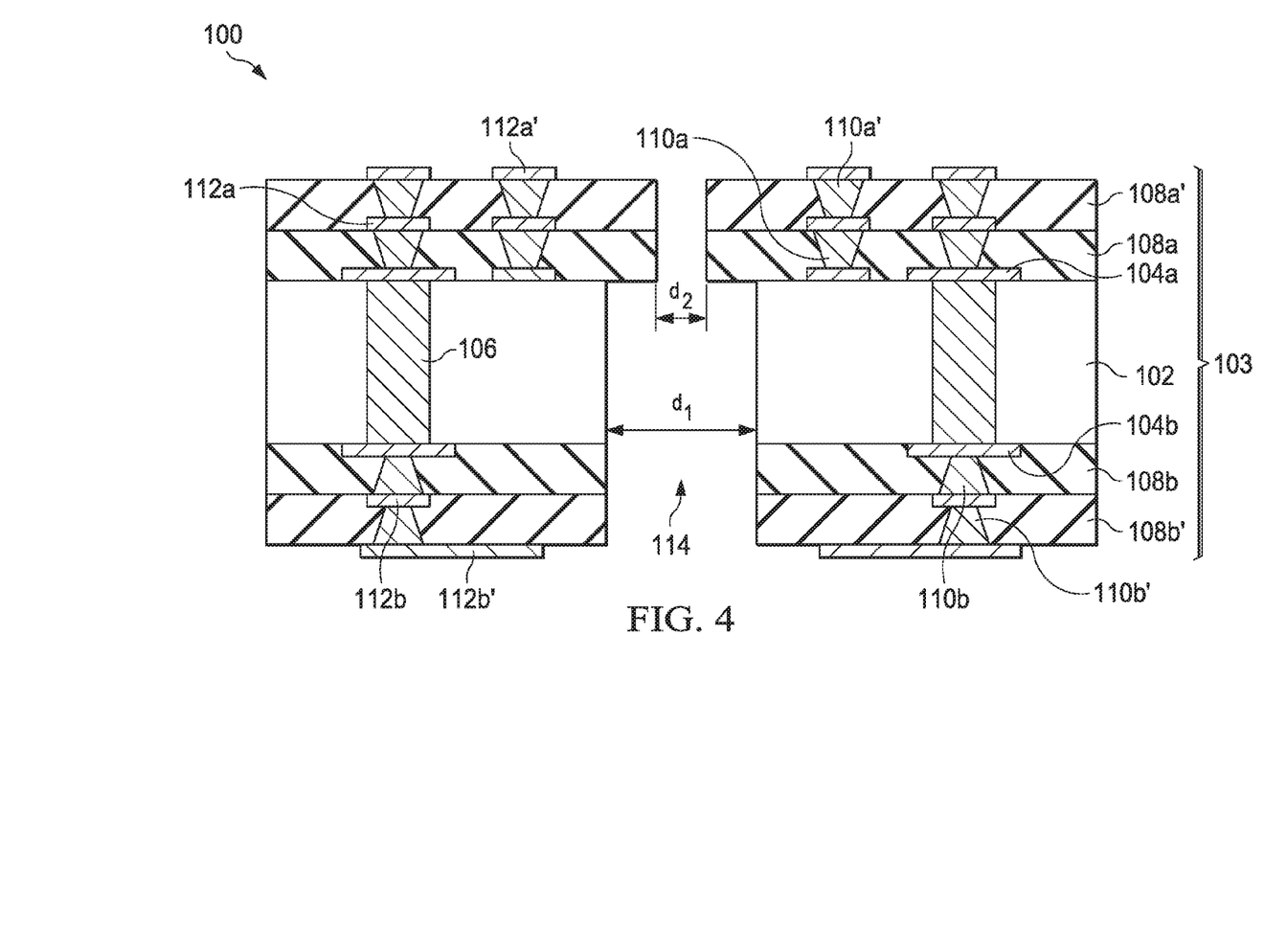

In accordance with some embodiments of the present disclosure, at least one aperture 114 is formed in a substrate 103 which includes the substrate core 102 and insulating materials 108a, 108a', 108b, and 108b', as shown in FIG. 4. The aperture 114 extends completely through the package substrate 100 in some embodiments, also shown in FIG. 4. The aperture 114 comprises a spot-faced aperture in accordance with some embodiments that includes a first region having a diameter or width comprising dimension $d_1$ and a second region having a diameter or width comprising dimension $d_2$. The width of the first region comprising dimension $d_1$ is greater than the width of the second region comprising dimension $d_2$ in some embodiments. The first width comprising dimension $d_1$ is about two times or greater than the second width comprising dimension $d_2$ in some embodiments, for example.

Dimension $d_1$ comprises about 2 millimeters (mm) or greater in some embodiments, and dimension $d_2$ comprises about 1 mm or less in some embodiments, as examples. Dimension $d_1$ comprises about 2.26 mm, and dimension $d_2$ comprises about 0.5 mm in some embodiments, as another example. Dimension $d_1$ is about 4 times or greater than dimension $d_2$ in some embodiments, as yet another example. Alternatively, dimensions $d_1$ and $d_2$ of the aperture 114 may comprise other values and other relative values.

Figure 6:
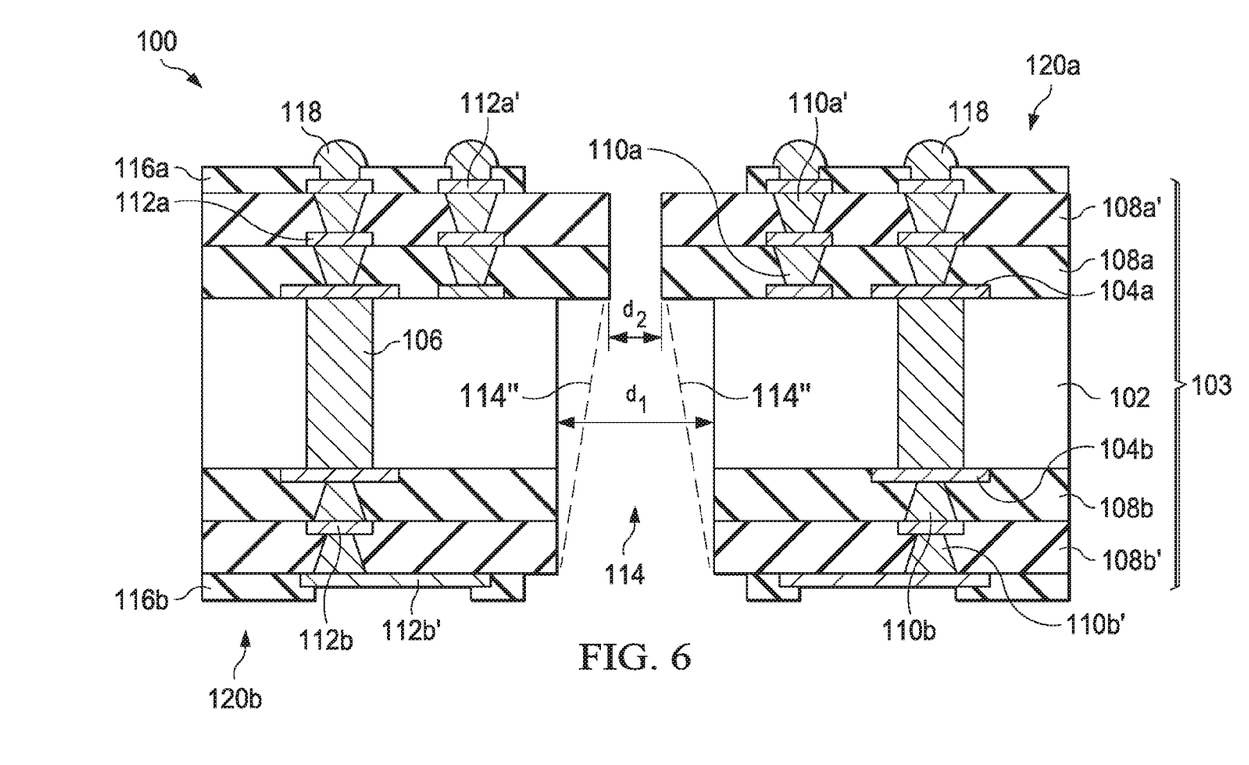

In some embodiments, the aperture 114 may further comprise a third dimension, not shown in FIG. 4 (see FIG. 6). The third dimension may be greater than dimension $d_2$ and less than dimension $d_1$ in some embodiments, also not shown. The aperture 114 may include an intermediate region disposed between the first region and the second region, wherein the intermediate region comprises the third dimension, for example.

The aperture 114 is formed using a drilling process in some embodiments. The drilling process may comprise a mechanical process (e.g., by drilling holes in the package substrate 100), a laser process, a lithography process, or other methods. The first region of the aperture 114 may be formed using a first drill bit, and the second region of the aperture 114 may be formed using a second drill bit, wherein the second drill bit is smaller than the first drill bit, for example. The first region of the aperture 114 having the diameter or width comprising dimension $d_1$ comprises a tank region in some embodiments. The tank region comprises an underfill tank that is adapted to receive and retain an underfill material during an underfill material dispensing process, to be described further herein. The second region of the aperture 114 having the diameter or width comprising dimension $d_2$ comprises a pin-hole region in some embodiments. The pin-hole region is coupled to the tank region, for example. The pin-hole region comprises an injection channel for the underfill material during the underfill material dispensing process, also to be described further herein. The pin-hole region of the aperture 114 is disposed within a material layer (e.g., within insulating materials 108a and 108a' shown in FIG. 4) disposed over the substrate core 102, in some embodiments.

Figure 5:
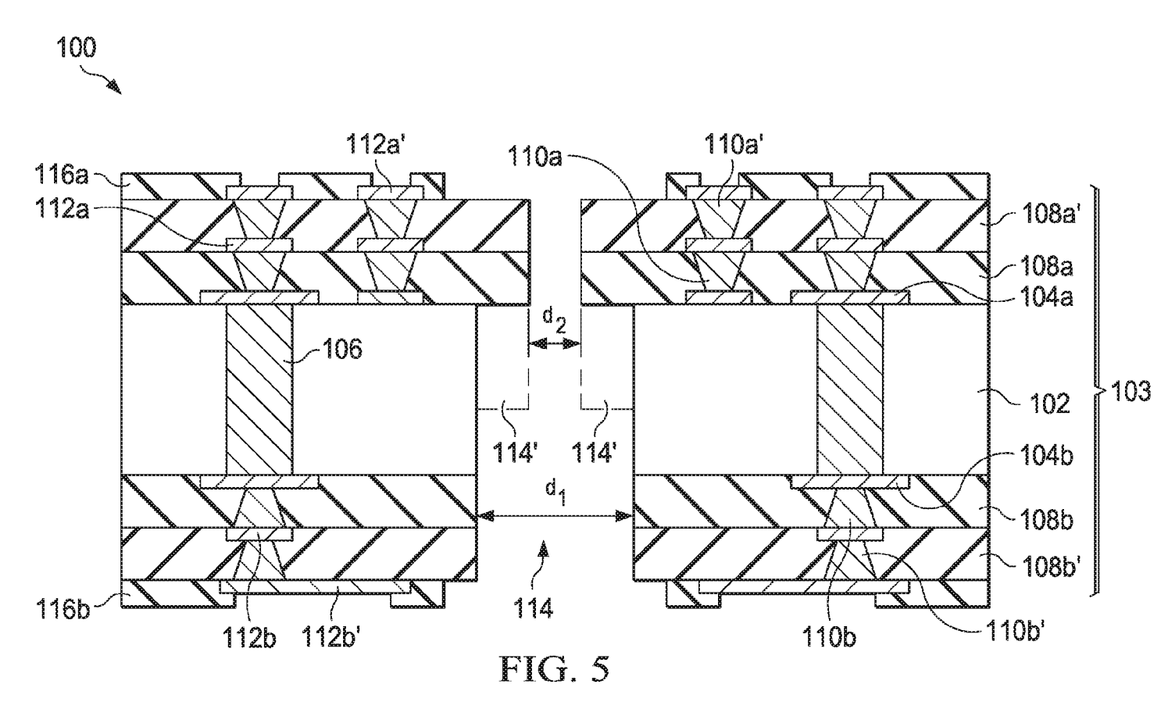

An insulating material 116a and 116b is formed on both sides of the substrate core 102, e.g., over insulating materials 108a' and 108b' and contacts 112a' and 112b', respectively, as shown in FIG. 5. The insulating materials 116a and 116b comprise a solder resist in some embodiments, for example. Portions of the insulating materials 116a and 116b are removed from over the contacts 112a' and 112b', also shown in FIG. 5.

A plurality of conductive bumps 118 are formed on a first side 120a of the package substrate 100, as shown in FIG. 6. The conductive bumps 118 comprise a plurality of connectors comprised of conductive material in some embodiments. The conductive bumps 118 comprise a plurality of controlled collapse chip connection (C4) bumps in accordance with some embodiments. The conductive bumps 118 may comprise a eutectic material such as solder, for example. The conductive bumps 118 may be formed using a ball drop process or a solder bath, for example. Alternatively, the conductive bumps 118 may comprise other materials and may be formed using other methods.

Contacts 112a' comprise contact pads disposed on the first side 120a of the package substrate 100 that the conductive bumps 118 are coupled to in some embodiments, for example, also shown in FIG. 6. Contacts 112b' comprise contact pads on a second side 120b of the package substrate 100 opposite the first side 120a that conductive bumps may be coupled to (not shown in FIG. 6; see connectors 122 comprising conductive bumps shown in FIG. 7). The contacts 112a' and 112b' are disposed on opposite sides of the substrate 103, for example.

The first side 120a of the substrate 103 (and also of the package substrate 100) includes a region for mounting an integrated circuit (see integrated circuit 130 shown in FIG. 9) thereon. The second side 120b of the substrate 103 and package substrate 100 includes a region for coupling a plurality of connectors (see connectors 122 shown in FIG. 7). The substrate core 102 also comprises the first side 120a and the second side 120b opposite the first side 120a, in some embodiments, for example. The pin-hole region of the spot-faced aperture 114 comprising dimension $d_2$ is disposed proximate the first side 120a of the package substrate 100, substrate 103, or substrate core 102, and the tank region of the spot-faced aperture 114 comprising dimension $d_1$ is disposed proximate the second side 120b of the package substrate 100, substrate 103, or substrate core 102 in some embodiments, for example.

In some embodiments, the tank region of the spot-faced aperture 114 comprising dimension $d_1$ comprises substantially straight sidewalls, as shown in FIGS. 4 through 6. Alternatively, the tank region of the spot-faced aperture 114 comprising dimension $d_1$ may comprise angled sidewalls, as shown in phantom (e.g., in dashed lines) in FIG. 6 at 114". The sidewalls of the tank region of the spot-faced aperture 114 may be chamfered inwardly towards a center of the substrate core 102 or towards an opposite side of the substrate core 102, for example. Likewise, the sidewalls of the pin-hole region comprising dimension $d_2$ may comprise substantially straight sidewalls or angled sidewalls (not shown).

In some embodiments, the substrate core 102 and insulating materials 108a, 108a', 108b, and 108b' comprise a substrate 103 after the formation of the insulating materials 108a, 108a', 108b, and 108b' on the substrate core 102. The substrate 103 includes the insulating materials 108a, 108a', 108b, and 108b' after forming the insulating materials 108a, 108a', 108b, and 108b' on the substrate core 102 in some embodiments, for example. The pin-hole region and/or the tank region of the spot-faced aperture 114 are formed in the insulating materials 108a, 108a', 108b, and/or 108b' of the substrate 103 in some embodiments. For example, in the embodiments shown in FIGS. 4 through 6, the pin-hole region comprising dimension $d_2$ is formed in insulating materials 108a and 108a', and the tank region comprising dimension $d_1$ is formed in the substrate core 102 and insulating materials 108b and 108b'. Alternatively, the pin-hole region may also be formed within a portion of the substrate core 102, as shown in phantom in FIG. 5 at 114'.

Figure 7:
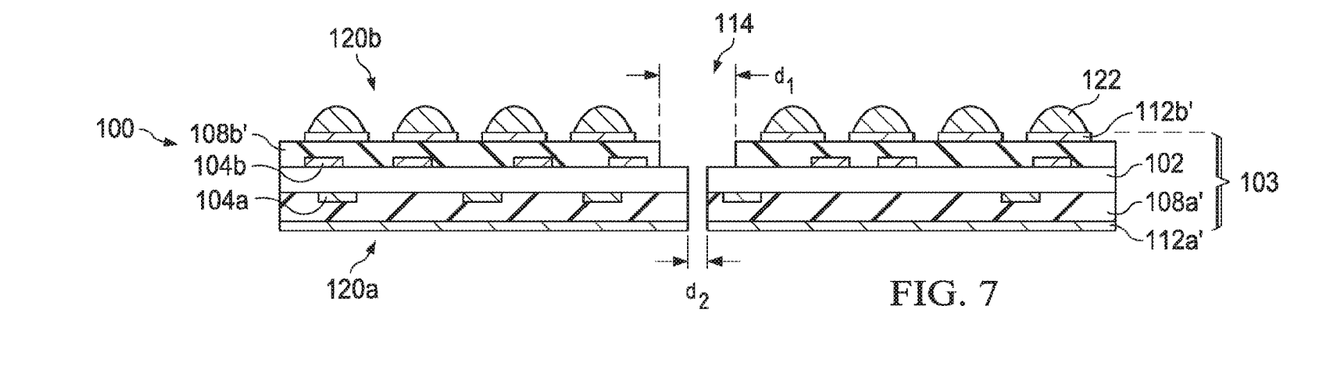
FIG. 7 is a cross-sectional view of a package substrate in accordance with some embodiments.

In other embodiments, the tank region of the aperture 114 is formed in an insulating material 108b', and the pin-hole region of the aperture 114 is formed in the substrate core 102 and insulating material 108a', as shown in FIG. 7, which is a cross-sectional view of a package substrate 100 in accordance with some embodiments. Alternatively, the tank region and pin-hole region of the aperture 114 may be formed within various combinations of the insulating materials 108a, 108a', 108b, 108b' and portions of or an entire thickness of the substrate core 102. The aperture 144 comprising the spot-faced shape is formed in a package substrate 100 in some embodiments, as another example.

In accordance with some embodiments, the package substrate 100 is inverted during the application of an underfill material and during a curing process of the underfill material. FIG. 7 shows a package substrate 100 that has been inverted, with the tank region comprising dimension $d_1$ of the aperture 114 proximate a second side 120b of the package substrate 100 or substrate 103 facing upwards. The conductive material comprising contacts 112a' is not shown as patterned for the sake of simplicity in FIGS. 7, 9, 10, and 11; however, the conductive material layer comprises a plurality of contacts 112a', as shown in FIGS. 2 through 6 in some embodiments, for example. Contacts 112a and 112b and insulating materials 108a and 108b are not shown or included in FIGS. 7, 9, 10, and 11; however, these elements and material layers may be included, or may not be included, in the substrate 103 in accordance with some embodiments.

Figure 8:
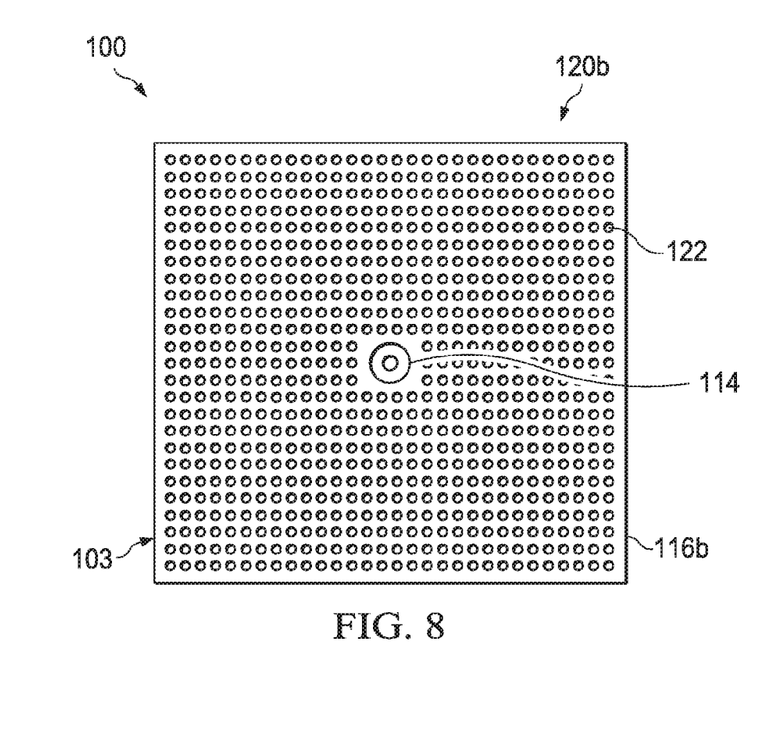
FIG. 8 is a top view of the package substrate shown in FIG. 7 in accordance with some embodiments.

FIG. 8 is a top view of the inverted package substrate 100 shown in FIG. 7 in accordance with some embodiments. For example, the view shown in FIG. 8 is a view of the bottom of the package substrate 100 (e.g., when the package substrate 100 is not inverted, with the connectors 122 facing downward). The connectors 122 are formed over the bottom surface of the package substrate 100 in an array arrangement. The array arrangement may comprise a ball grid array (BGA) in some embodiments, for example. The array may be fully populated as shown in FIG. 8, or the array may be partially populated in various patterns (not shown).

Only one aperture 114 is shown in each of the drawings; alternatively, a plurality of apertures 114 may be formed across a surface of the package substrate 100. For example, in FIG. 8, a single aperture 114 is disposed in a substantially central region of the package substrate 100. Alternatively, the aperture 114 may be disposed in a non-central region of the package substrate 100, not shown. In other embodiments, two or more apertures 114 comprising a spot-faced shape with two different diameters or widths comprising $d_1$ and $d_2$ may be formed across a surface of the package substrate 100 within the substrate 103, also not shown. Three or more apertures 114 may be formed across the surface of the substrate 103 at evenly or unevenly spaced-out intervals, as another example.

Figure 9:
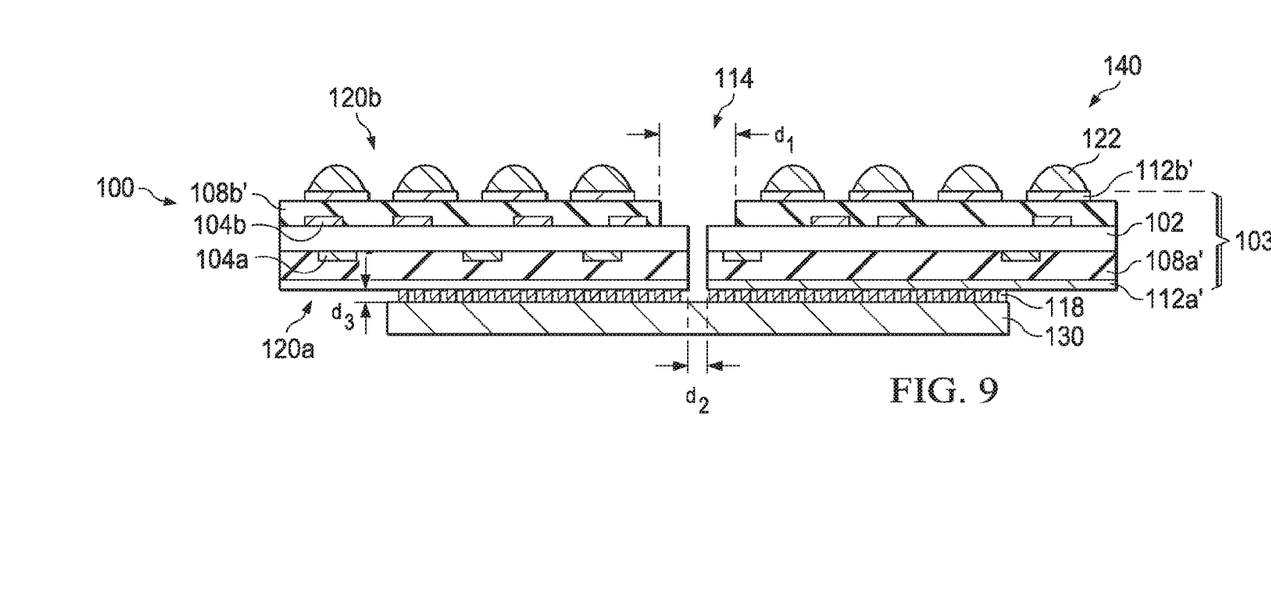
FIGS. 9 through 11 are cross-sectional views of a method of packaging a semiconductor device at various stages in accordance with some embodiments.
Figure 10:
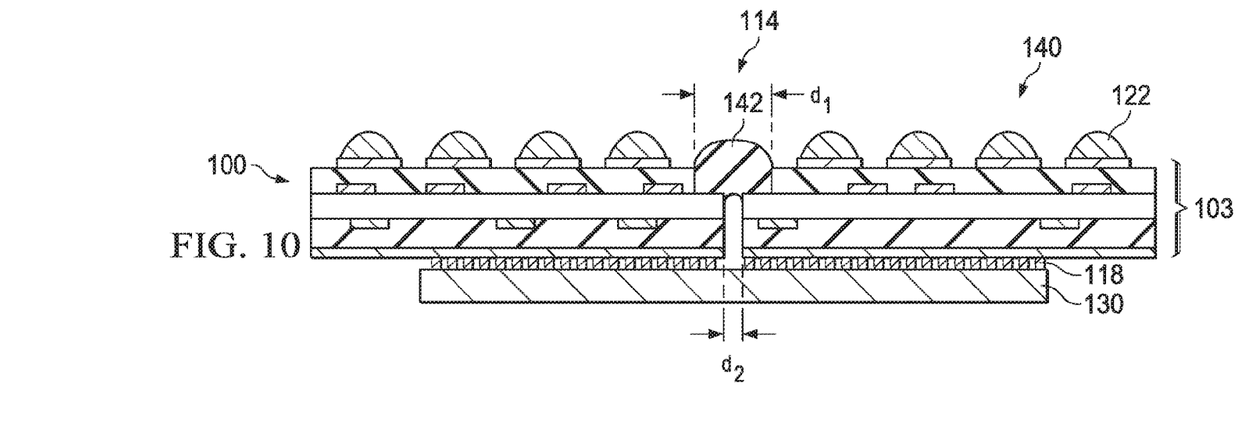
Figure 11:
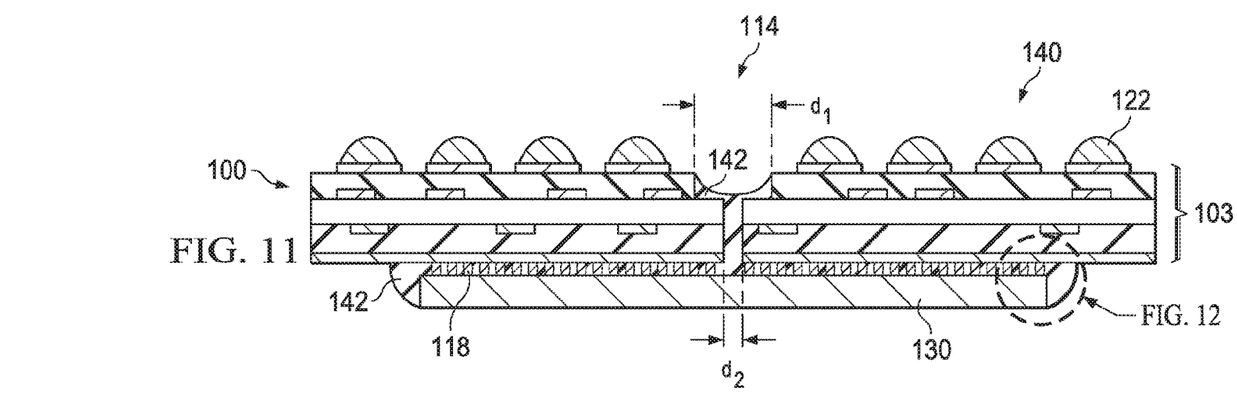

FIGS. 9 through 11 are cross-sectional views of a method of packaging a semiconductor device at various stages in accordance with some embodiments. First, an integrated circuit 130 is coupled to the first side 120a of the package substrate 100. The integrated circuit 130 may be coupled to connectors 118 disposed on contacts 112a' of the package substrate 100 (not shown in FIGS. 9 through 11; see FIG. 6). The integrated circuit 130 may be coupled to the connectors 118 using a solder reflow process, for example. The integrated circuit 130 is coupled to the package substrate using a flip-chip bonding process or other process, for example. The connectors 118 provide electrical and mechanical connection of the integrated circuit 130 to the package substrate 100.

The packaged semiconductor device 140 includes the package substrate 100, the integrated circuit 130, and the connectors 118 disposed between the package substrate 100 and the integrated circuit 130. The integrated circuit 130 may include a stand-off height comprising dimension $d_3$ away from the package substrate 100. In some embodiments, the stand-off height comprising dimension $d_3$ may comprise about 60 µm or less, as an example. Alternatively, dimension $d_3$ may comprise other values. Dimension $d_3$ may comprise about 15 µm to about 150 µm in some embodiments, as another example.

In some embodiments, the connectors 118 may be coupled to the package substrate 100, and then the integrated circuit 130 is coupled to the package substrate 100. In other embodiments, the connectors 118 may be coupled to the integrated circuit 130, and then the package substrate 100 is coupled to the integrated circuit 130. In other embodiments, connectors 118 may be coupled to both the integrated circuit 130 and the package substrate 100, the integrated circuit 130 is placed on the package substrate 100, and a eutectic material of the connectors 118 is reflowed to connect the integrated circuit 130 to the package substrate 100.

After the integrated circuit 130 is attached to the package substrate 100, an underfill material 142 is disposed within the aperture 114, as shown in FIG. 10. The underfill material 142 is dispensed into the tank region of the aperture 114, for example. The underfill material 142 comprises an epoxy or resin in some embodiments. The underfill material 142 comprises a molding compound in some embodiments. The underfill material 142 may alternatively comprise other insulating materials. The underfill material 142 comprises a material that is a fluid when applied, so that it flows from the tank region of the aperture 114 and into the pin-hole region of the aperture 114, as shown in FIG. 11. The underfill material 142 is dispensed into the tank region of the aperture 114 and passes through the pin-hole region of the aperture 114 to flow between the integrated circuit 130 and the package substrate 100. The underfill material 142 flows between the connectors 118, substantially filling the space between the integrated circuit 130 and the package substrate 100, as shown in FIG. 11. The underfill material 142 fills a gap between the integrated circuit 130 and the packaging substrate 100, providing a protection layer for the connectors 118.

The underfill material 142 is then cured. Curing the underfill material 142 may comprise heating the packaged semiconductor device 140 to a predetermined temperature, such as about 125 degrees C. to about 200 degrees C. for about 30 minutes to about 120 minutes. The curing process may also comprise other temperatures and time durations. Alternatively, the underfill material 142 may be cured using ultraviolet (UV) light, infrared (IR) energy, or other methods, for example.

After the curing process for the underfill material 142, the underfill material 142 is disposed within at least a portion of the pin-hole region of the aperture 114 in some embodiments. The underfill material 142 is disposed within the entire pin-hole region of the aperture 114 in some embodiments, as shown in FIG. 11. The underfill material 142 is not disposed within the tank region of the aperture 114 after the curing process in some embodiments. In other embodiments, the underfill material 142 is disposed within at least a portion of the tank region of the aperture 114 in some embodiments, as shown in FIG. 11. The top surface of the underfill material 142 may comprise a curved shape due to a shrinkage and/or a meniscus effect during the curing of the underfill material 142, for example.

In some embodiments, the packaged semiconductor device 140 is maintained in an inverted position with the tank region of the aperture 114 facing upwards, during the underfill material 142 dispensing process and also during the curing process for the underfill material 142.

Figure 12:
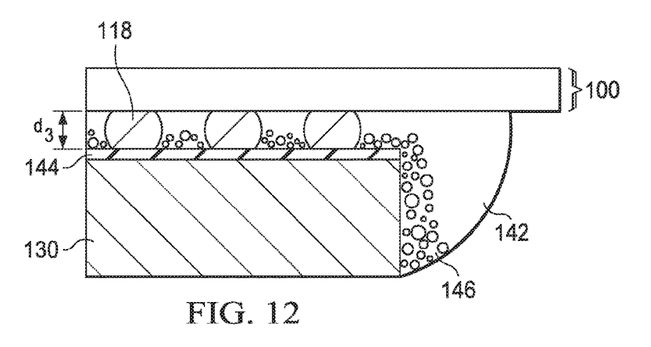
FIG. 12 is a more detailed view of a portion of the packaged semiconductor device shown in FIG. 11 in accordance with some embodiments.

FIG. 12 is a more detailed view of a portion of the packaged semiconductor device 140 shown in FIG. 11 in accordance with some embodiments. The underfill material 142 includes a filler 146 in some embodiments. The filler 146 may include silica, SiC, or C, for example. Alternatively, the filler 146 may comprise other materials. Advantageously, more of the filler 146 of the underfill material 142 is disposed proximate the integrated circuit 130 than proximate the package substrate 100 in some embodiments, because the underfill material 142 is cured with the package substrate 100 inverted in a backside-up position. This is advantageous particularly in applications wherein the integrated circuit 130 includes a low dielectric constant (k) insulating material 144 disposed thereon, which material may comprise a porous and/or rather delicate material in some embodiments, for example.

Figure 13A:
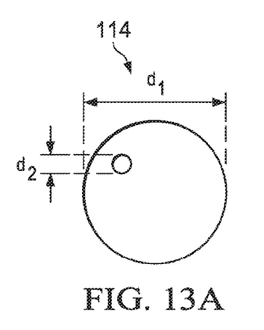
FIGS. 13A through 13C are top views of spot-faced apertures of a package substrate in accordance with some embodiments.
Figure 13B:
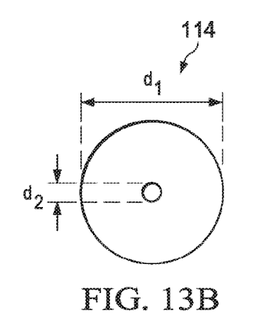
Figure 13C:
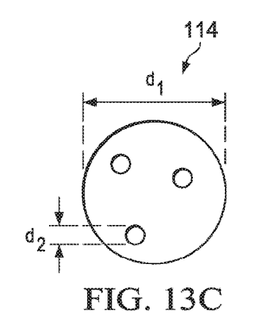

FIGS. 13A, 13B, and 13C are top views of spot-faced apertures 114 of a package substrate 100 (see package substrates 100 shown in FIGS. 1 through 7 and 9 through 12) in accordance with some embodiments, illustrating various configurations and shapes of the spot-faced apertures 114. In some embodiments, the pin-hole region comprising dimension $d_2$ is off-center from the tank region comprising dimension $d_1$, as shown in FIG. 13A. In some embodiments, the pin-hole region comprising dimension $d_2$ is substantially on-center with the tank region comprising dimension $d_1$, as shown in FIG. 13B. In other embodiments, the aperture 114 includes a plurality of pin-hole regions comprising dimension $d_2$ that may or may not be off-center from the tank region comprising dimension $d_1$, as shown in FIG. 13C.

Figure 14:
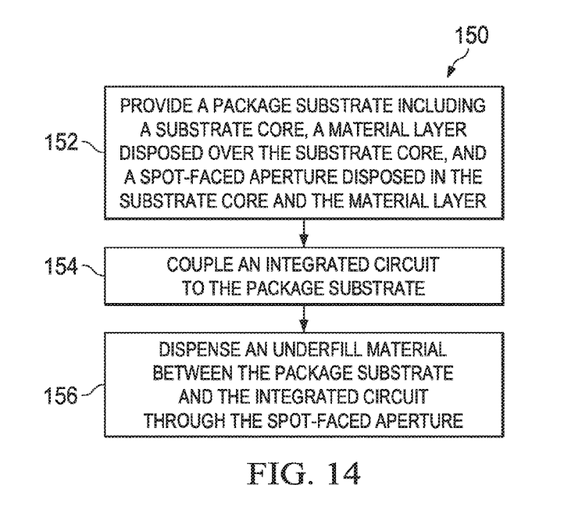
FIG. 14 is a flow chart of a method of packaging a semiconductor device in accordance with some embodiments.

FIG. 14 is a flow chart 150 of a method of packaging a semiconductor device in accordance with some embodiments. In step 152, a package substrate 100 (see also FIG. 7) is provided that includes a substrate core 102, a material layer 108a' and/or 108b' disposed over the substrate core 102, and a spot-faced aperture 114 disposed in the substrate core 102 and the material layer 108a' and/or 108b'. In step 154, an integrated circuit 130 is coupled to the package substrate 100 (see FIG. 9). In step 156, an underfill material 142 is dispensed between the package substrate 100 and the integrated circuit 130 through the spot-faced aperture 114 (see FIGS. 10 and 11).

The underfill material 142 is cured after dispensing the underfill material 142 in some embodiments. Disposing the underfill material 142 further comprises injecting the underfill material 142 through the pin-hole region of the spot-faced aperture 114 in some embodiments. Providing the package substrate 100 comprises providing a flip chip package in some embodiments, as another example.

Some embodiments of the present disclosure comprise packaging methods for semiconductor devices using the novel package substrates 100 described herein. Other embodiments comprise package substrates 100 for semiconductor devices. Other embodiments include packaged semiconductor devices that have been packaged using the package substrates 100 described herein. Other embodiments include methods of manufacturing the package substrates 100.

Advantages of some embodiments of the present disclosure include providing novel package substrates 100 that include the spot-faced apertures 114 described herein. Dispensing the underfill material 142 through the spot-faced apertures 114 avoids having to dispense the underfill material 142 along an edge or two of the integrated circuit, which avoids either not dispensing enough of the underfill material 142 beneath the integrated circuit, or avoids overfilling the space which could result in creeping (e.g., overflow) of the underfill material 142. Furthermore, a need for repetition of application of the underfill material 142 is avoided. A one-pass dispensing of the underfill material 142 is achievable, which results in a time-savings, a cost-savings, and improved or increased units per hour (UPH) in the packaging process flow and underfill material 142 application process. Process through-put is increased, resulting in improved manufacturing and packaging efficiency in some embodiments, for example.

Required bump area and routing area of the substrate 103 for the apertures 114 is minimized, due to the spot-faced shape of the apertures 114. A stronger capillary effect is achieved, which further improves the throughput, as a result of the fine pin-hole region of the apertures 114. The novel apertures 114 in the package substrates 100 comprise a wider tank region and a narrower pin-hole region. A faster underfill material injection is achievable due to the stronger capillary effect of the pin-hole region of the apertures 114. Dispensing the underfill material through the spot-faced aperture(s) also results in a faster spreading speed of the underfill material.

Improved protection for integrated circuits is provided in embodiments wherein the package is cured in a backside-up position, due to fillers within the underfill material resulting in being adjacent to the integrated circuit. The accumulated filler proximate the integrated circuits provides more protection for material layers of the integrated circuits, and strengthens contacts, contact pads, and under-ball metallization structures of the integrated circuits and packaging substrates.

Embodiments of the present disclosure are particularly advantageous in flip-chip ball grid array (FCBGA) packaging schemes that may have ultra-thin integrated circuit dimensions and low bump heights of about 60 μm or less (e.g., comprising dimension $d_3$ described herein), for example.

In some embodiments, a package substrate for a semiconductor device includes a substrate core and a material layer disposed over the substrate core. The package substrate includes a spot-faced aperture disposed in the substrate core and the material layer.

In some embodiments, a packaged semiconductor device includes a package substrate including a substrate core, a material layer disposed over the substrate core, and a spot-faced aperture disposed in the substrate core and the material layer. The spot-faced aperture includes a tank region and a pin-hole region coupled to the tank region. An integrated circuit is coupled to the package substrate.

In some embodiments, a method of packaging a semiconductor device includes providing a package substrate including a substrate core, a material layer disposed over the substrate core, and a spot-faced aperture disposed in the substrate core and the material layer. The method includes coupling an integrated circuit to the package substrate. An underfill material is dispensed between the package substrate and the integrated circuit through the spot-faced aperture.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging a semiconductor device, the method comprising:
   providing a package substrate including a substrate core and a material layer disposed over the substrate core;
   patterning an aperture in the substrate core and the material layer, wherein the aperture comprises:
      a first region having a first diameter; and
      a second region connected to the first region and having a second diameter, the second diameter being less than the first diameter, and a center of the second region being offset from a center of the first region in a top-down view;
   coupling an integrated circuit to the package substrate; and
   dispensing an underfill material between the package substrate and the integrated circuit through the aperture.

2. The method of claim 1, further comprising curing the underfill material.

3. The method of claim 1, wherein coupling the integrated circuit to the package substrate comprises coupling the integrated circuit to a side of the package substrate proximate the second region of the aperture.

4. The method of claim 3, wherein dispensing the underfill material comprises injecting the underfill material into the first region, the underfill material flowing from the first region into the second region.

5. The method of claim 1, wherein providing the package substrate comprises providing a flip-chip package substrate.

6. The method of claim 1, wherein patterning the aperture comprises forming the first region such that the first region extends only partially through the substrate core.

7. The method of claim 1, wherein patterning the aperture comprises forming the first region to extend completely through the substrate core.

8. The method of claim 1, wherein the first region has slanted sidewalls.

9. A method comprising:
   patterning an aperture through a substrate core of a package substrate and a first material layer of the package substrate, wherein patterning the aperture comprises:
      defining a tank region extending through the substrate core, the tank region having a first diameter;
      defining a first pin-hole region coupled to the tank region, the first pin-hole region having a second diameter; and
      defining a second pin-hole region coupled to the tank region, the second pin-hole region having a third diameter, the first pin-hole region being physically separated from the second pin-hole region, the first pin-hole region and second pin-hole region extending through the first material layer, wherein the first diameter is greater than the second diameter and the third diameter;
   bonding an integrated circuit die to the package substrate, the tank region being disposed on an opposing side of the first pin-hole region as the integrated circuit die; and
   dispensing an underfill between the package substrate and the integrated circuit die through the tank region, the first pin-hole region, and the second pin-hole region.

10. The method of claim 9, wherein defining the tank region comprises defining the tank region to extend through a second material layer and into the substrate core, wherein the substrate core is interposed between the first material layer and the second material layer.

11. The method of claim 10, wherein sidewalls of the tank region in the second material layer and the substrate core are slanted.

12. The method of claim 9, wherein patterning the aperture further comprises defining a third pin-hole region coupled to the tank region, the third pin-hole region having a fourth diameter, the third pin-hole region being physically separated from the first pin-hole region and the second pin-hole region, the third pin-hole region extending through the first material layer, wherein the first diameter is greater than the fourth diameter.

13. The method of claim 9, wherein the second pin-hole region extends partially through the substrate core.

14. The method of claim 9, wherein the underfill comprises a filler.

15. The method of claim 14, wherein a concentration of the filler in the underfill is greater adjacent the integrated circuit die than the package substrate.

16. A method of packaging a semiconductor device, the method comprising:
   patterning an opening extending through a package substrate, wherein patterning the opening comprises:

patterning a first region having a first diameter in a substrate core of the package substrate; and patterning a second region connected to the first region in a material layer adjoining the substrate core, the second region having a second diameter different than the first diameter, a center of the second region being offset from a center of the first region in a top-down view;

coupling an integrated circuit die to a surface of the package substrate; and dispensing an underfill material between the package substrate and the integrated circuit die, wherein the underfill material is dispensed through an opposing side of the package substrate as the integrated circuit die through the opening.

17. The method of claim 16, wherein the underfill material comprises a filler, a concentration of the filler in the underfill material being greater adjacent the integrated circuit die than the package substrate.

18. The method of claim 16, wherein patterning the opening further comprises:

patterning a third region connected to the first region in the material layer adjoining the substrate core, the third region having a third diameter different than the first diameter, a center of the third region being offset from the center of the first region in a top-down view.

19. The method of claim 16, wherein the first diameter is two times or greater than the second diameter.

20. The method of claim 16, wherein the first diameter is 2 mm or greater, and wherein the second diameter is 1 mm or less.

* * * * *